(12) United States Patent
Takahashi et al.

(10) Patent No.: US 6,182,742 B1
(45) Date of Patent: Feb. 6, 2001

(54) COOLING APPARATUS FOR USE IN AN ELECTRONIC SYSTEM

(75) Inventors: Tatsuya Takahashi; Shizuo Zushi; Tetsuo Ogata, all of Hadano (JP)

(73) Assignees: Hitachi, Ltd.; Hitachi Microcomputer Systems Ltd., both of Tokyo (JP)

( * ) Notice: Under 35 U.S.C. 154(b), the term of this patent shall be extended for 0 days.

(21) Appl. No.: 08/879,303

(22) Filed: Jun. 19, 1997

(30) Foreign Application Priority Data

Jun. 21, 1996 (JP) .................................................... 8-161523

(51) Int. Cl.[7] .................................................... F28D 15/00

(52) U.S. Cl. ................................ 165/104.33; 165/104.33; 165/200; 165/80.4; 62/259.2; 361/699

(58) Field of Search ............................... 165/104.33, 200, 165/80.4; 62/259.2; 361/699

(56) References Cited

FOREIGN PATENT DOCUMENTS 61-125634    6/1986   (JP) .

*Primary Examiner*—Ira S. Lazarus
*Assistant Examiner*—Terrell McKinnon
(74) *Attorney, Agent, or Firm*—Mattingly, Stanger & Malur, P.C.

(57) ABSTRACT

A cooling apparatus for use with an electronic system provides an uninterrupted operation capability. A pump supplies a cooling liquid to a liquid-cooled electronic system. The pump is controlled by a controller that also controls a three way valve for controlling the operation of a three-way valve for regulating the flow quantity of the cooling liquid flowing into a heat exchanger for cooling the cooling liquid. The cooling apparatus has a plurality of cooling control units. While one cooling control unit is in operation, the other is in the standby state. If one cooling control unit fails, the standby cooling control unit is automatically put in the operating state, thereby allowing servicing of the failing unit without interrupting the operation of the liquid-cooled electronic system and the cooling apparatus.

16 Claims, 2 Drawing Sheets

COOLING APPARATUS FOR USE IN AN ELECTRONIC SYSTEM

BACKGROUND OF THE INVENTION

1. Field of the Invention

The present invention relates to a cooling apparatus for a liquid-cooled electronic system.

2. Description of Related Art

Conventional cooling apparatuses for cooling electronic systems circulate a cooling liquid in a liquid-cooled electronic system such as a computer to cool the load. One of the conventional electronic system cooling apparatuses, for example that disclosed in Japanese Non-examined Patent Publication No. 61-125634, for example, normally has two units of pumps for supplying the cooling liquid, one for normal use and the other in standby mode for taking over the cooling operation when the former fails. Thus, providing the two units of pumps makes it practical to put the standby unit in the operating state if the normally operating unit fails for continued cooling.

However, in the prior-art systems, the cooling apparatus cannot be serviced when the electronic system such as a computer being cooled is in operation. To be specific, the prior-art electronic system cooling apparatus has a controller for controlling the operation of the pumps and valves. Any attempt to service the controller, such as upgrading the controller, requires the operator to stop the controller which halts the entire cooling apparatus because the cooling apparatus of the prior art has only one controller, making it impractical to service the cooling apparatus while it is in operation.

Recently, there is a strong demand for an around-the-clock operation capability for such cooling apparatuses that cool electronic systems, including computers, such as large main frame computers. However, the prior-art apparatuses cannot satisfy this requirement by reason of the above-mentioned problem.

SUMMARY OF THE INVENTION

It is therefore an object of the present invention to provide an electronic system cooling apparatus that ensures an around-the-clock performance capability of the electronic systems, including computers that are cooled by the cooling apparatus.

In carrying out the invention and according to one aspect thereof, there is provided an electronic system cooling apparatus having a plurality of pumps for supplying a cooling liquid to a liquid-cooled electronic system and a plurality of controllers for controlling operations of the plurality of pumps, wherein the plurality of controllers are provided for the plurality of pumps on a one for one basis to control the plurality of pumps separately. This arrangement provides around-the-clock availability to the electronic system cooling apparatus, according to the invention as explained in the following.

In particular, the electronic system cooling apparatus has a plurality of heat exchangers for cooling the cooling liquid; and a plurality of three-way valves for regulating a quantity of flow of the cooling liquid that flows to the plurality of heat exchangers, wherein the plurality of heat exchangers and three-way valves are provided for the plurality of controllers and pumps on a one for one basis. The plurality of controllers control the plurality of three-way valves and the corresponding units of the plurality of heat exchangers.

The plurality of three-way valves, the plurality of controllers and the plurality of pumps are constituted as separate cooling control units. This arrangement also provides for an around-the-clock operation capability for the electronic system cooling apparatus if a heat exchanger failure or a three-way valve failure occurs.

The above-mentioned electronic system cooling apparatus has a plurality of cooling units for cooling the cooling liquid, wherein the plurality of controllers controls the cooling efficiency of each of the plurality of cooling units. This arrangement also ensures an around-the-clock performance capability of the electronic system cooling apparatus if a cooling unit failure occurs.

The above and other objects, features and advantages of the present invention will become more apparent from the accompanying drawings, in which like reference numerals are used to identify the same or similar parts in several views.

DETAILED DESCRIPTION OF PREFERRED EMBODIMENTS

This invention will be described in further detail by way of example with reference to the accompanying drawings.

Figure 1:
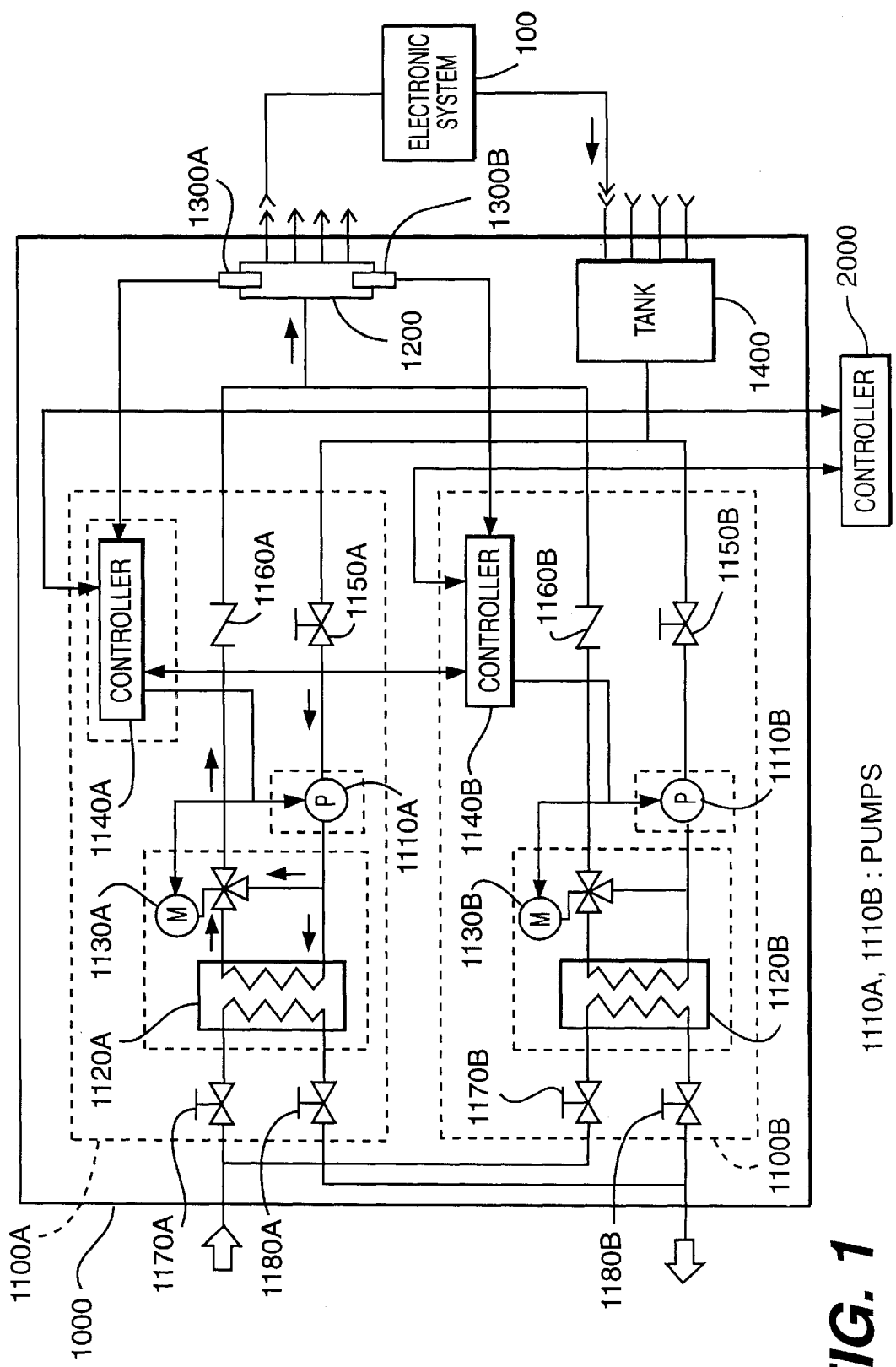
FIG. 1 is a block diagram of an electronic system cooling apparatus according to a preferred embodiment of the present invention.

FIG. 1 shows an electronic system cooling apparatus 1000 according to one preferred embodiment of the present invention in which cooling liquid is supplied to the liquid-cooled electronic system 100 such as a computer. In the figure, only one cooling apparatus is shown. Actually, however, a plurality of the electronic systems 100 to be cooled could be connected to the cooling apparatus 1000.

A cooling apparatus 1000 internally has two cooling control units 1100A and 1100B of identical arrangement, a distribution header 1200 for distributing the cooling liquid to a plurality of electronic systems, temperature detectors 1300A and 1300B mounted on the distribution header 1200 for detecting temperatures of the cooling liquid, and a tank 1400 for temporarily storing the warmed cooling liquid returned from the plurality of electronic systems 100.

The cooling control unit 1100A includes the following components. A pump 1110A supplies the cooling liquid to the liquid-cooled electronic system 100. A heat exchanger 1120A is used for cooling the cooling liquid and a remote actuated three-way valve 1130A is provided for controlling the temperature of the cooling liquid. A controller 1140A controls the operations of the pump 1110A and the quantity of flow through the three-way valve 1130A. Also, valves 1150A, 1170A and 1180A, and a check valve 1160A are provided. The pump 1110A and the controller 1140A enclosed by dashed lines in the cooling control unit 1100A can be separately detached from the same for replacement. The heat exchanger 1120A and the three-way valve 1130A enclosed by dotted lines can be integrally detached from the cooling control unit 1100A for replacement.

In the present embodiment, a cooling control unit 1100B having the same arrangement as that of the cooling control unit 1100A is disposed in parallel to the cooling control unit 1100A. The cooling control unit 1100B, therefore, includes the same components, including a pump 1110B, a heat exchanger 1120B, a three-way valve 1130B, a controller 1140B, valves 1150B, 1170B and 1180B, and a check valve 1160B.

The preferred embodiment of FIG. 1, further has a controller 2000 that controls the controllers 1140A and 1140B.

The operation of the embodiment of FIG. 1 is described as follows. The two cooling control units 1100A and 1100B do not operate simultaneously; while one is in operation, the operation of the other is halted. In what follows, it is assumed that the cooling control unit 1100A is the one in the operating state.

The controller 1140A transmits a drive signal to the pump 1110A which pumps the cooling liquid stored in the tank 1400 through open valve 1150A. The flow of cooling liquid then branches in two directions. One branch flows into the heat exchanger 1120A and the other to the three-way valve 1130A. The three-way valve 1130A varies the ratio of the quantity of flow of the cooling liquid coming from the heat exchanger 1120A to the quantity of flow of the cooling liquid coming directly from the pump 1110A. This ratio is controllable by a control signal transmitted from the controller 1140A. Under control of valves 1170A and 1170B, chilled water, for example, of relatively low temperatures passes through heat exchanger 1120A to cool the cooling liquid pumped from the tank 1400 by the pump 1110A. Such chilled water is commonly available in buildings that use chilled water for air conditioning (4–16° C.), for example. The cooling liquid that flows out of the three-way valve 1130A passes the check valve 1160A to be introduced into the distribution header 1200. In the distribution header 1200, the cooling liquid is distributed to a plurality of flow paths to be sent out to the liquid-cooled electronic system 100. The cooling liquid warmed by the electronic system 100 is returned from the liquid-cooled electronic system 100 to the tank 1400.

The temperature of the cooling liquid is detected by the temperature detector 1300A mounted on the distribution header 1200. Based on the detection, the controller 1140A controls the ratio of the flow quantities of the two systems flowing in the three-way valve so that the temperature of the cooling liquid is set to a predetermined value, for example 23 degrees centigrade. If, for example, the temperature of the cooling liquid detected by the temperature detector is found to be higher than the predetermined level, the controller 1140A controls the ratio of the flow quantities in the three-way valve 1130A to increase the flow quantity of the cooling liquid passing the heat exchanger 1120A to lower the temperature of the cooling liquid.

It should be noted that the cooling liquid is prevented by the check valve 1160B from entering the control unit 1110B that is in the stopped state.

Thus constituted, the present embodiment allows the liquid-cooled electronic system to be kept cooled, when upgrading the controller 1140A, by stopping the controller 1140A and operating the controller 1140B, thereby keeping the liquid-cooled electronic system in the operating state.

The higher level controller 2000 that controls the controllers 1140A and 1140B monitors the operations of these lower controllers according to a predetermined timing to detect a fault in the operation of controller 1140A. When a fault is detected, controller 2000 automatically switches control from the failing controller 1140A to the controller 1140B, thereby automatically switching the cooling operation with the cooling control unit 1100A to the cooling control unit 1110B to continue the cooling of the liquid-cooled electronic system. Therefore, while the cooling control unit 1100B is cooling the liquid-cooled electronic system, the failing controller 1140A in the cooling control unit 1100A can be replaced. Examples of the faults that are detected include pump failure, loss of flow rate (detected by a not shown flow rate detector downstream of the three way valve, for example), abnormally high temperature detected at the distribution header 1300A and other related operations that can cause a lack of sufficient cooling for the electronic system 100.

Each of the controllers 1140A and 1140B can be a microcomputer or an arrangement of relay circuits using temperature feedback control, for example. The error detection that is performed by controller 2000 can be achieved by a service processor with a monitor, and may also have a redundant service processor in case of the failure of the controller 2000. A fault can be detected by use of a relay, for example, that is detected by the controller in the standby state and once the fault is detected the cooling control unit in operation is shut down and the other cooling control unit takes over to provide continuous cooling of the electronic system 100.

In particular, if the pump 1110A, the heat exchanger 1120A, or the three-way valve 1130A fails, the controller 1140A cannot control the temperature of the cooling liquid to the predetermined level, so that the controller 1140A detects the abnormal state of these components, stops the pump 1110A, and sends an abnormal signal to the controller 1140B of the cooling control unit 1100B. Receiving the abnormal signal, the controller 1140B starts the pump 1110B, upon which automatic switching is made from the cooling control unit 1100A to the cooling control unit 1100B to continue the cooling of the liquid-cooled electronic system. When, during the cooling operation by the cooling control unit 1100B, the failure is located, the cooling control unit 1100A can be replaced or repaired or the failing pump 1110A, heat exchanger 1120A or three-way valve 1130A for example is replaced. If water extraction is required for the replacing operation, the valve 1150A may be closed, thereby preventing interference with the operation of the cooling apparatus 1000 from occurring.

In the example of FIG. 1, the cooling control unit is composed of the two units of the cooling control units 1110A and 1110B. It will be apparent that, if the load of the liquid-cooled electronic system 100 requires a higher cooling capacity and a larger flow quantity of the cooling liquid, the cooling control unit may be composed of three or more units.

As described and according to the embodiment of the invention shown in FIG. 1, the cooling apparatus need not be stopped for servicing the controller, thereby ensuring an around-the-clock operation capability of the cooling apparatus.

According to the arrangement of the cooling apparatus of the present invention, the around-the-clock generation capability enables servicing and replacing the components other than the controller, as well.

Figure 2:
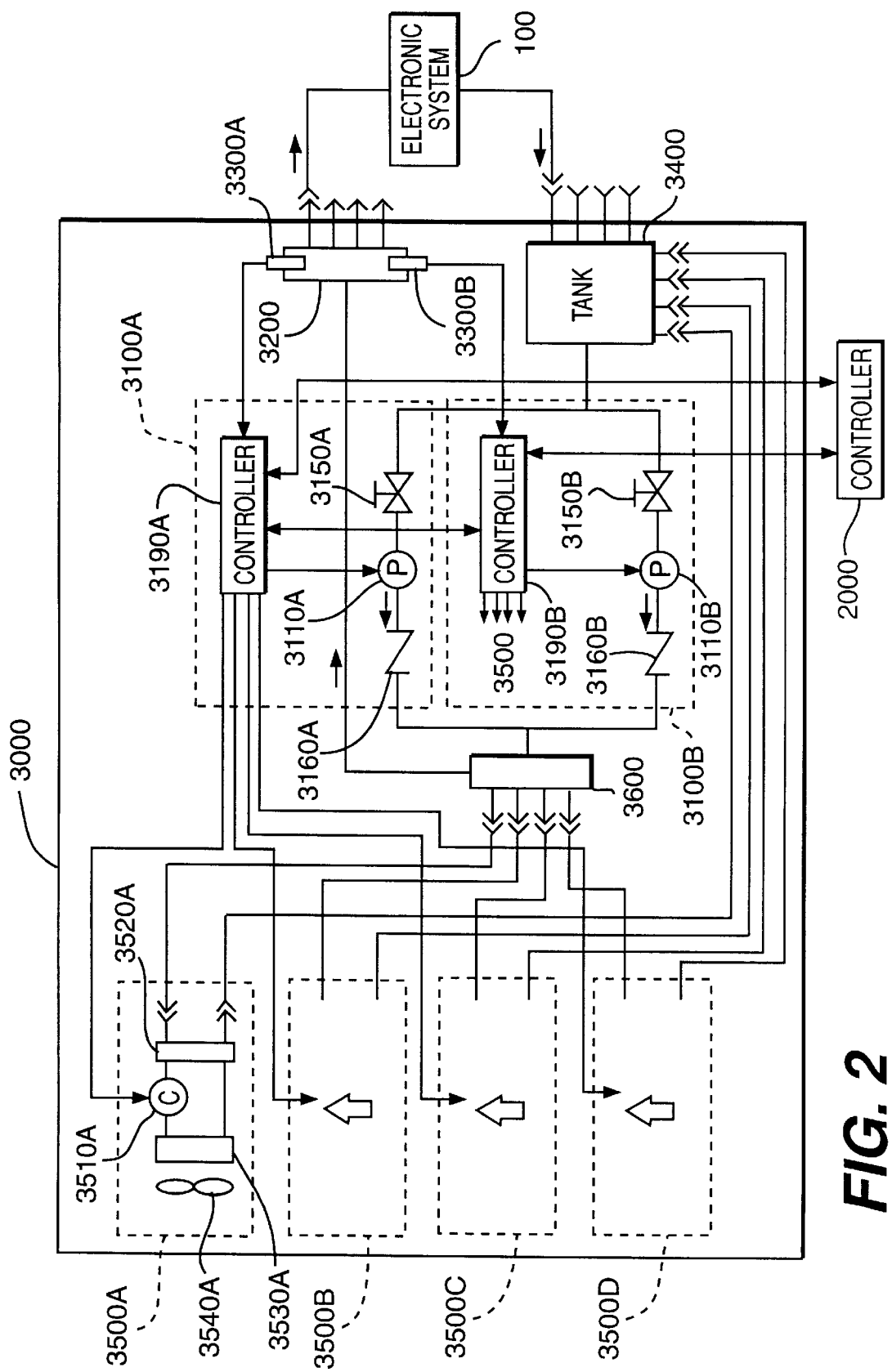
FIG. 2 is a block diagram of an electronic system cooling apparatus according to another preferred embodiment of the present invention.

An electronic system cooling apparatus according to another preferred embodiment of the present invention is shown in FIG. 2 in which the cooling unit is composed of a heat exchanger (and other components similar to the first embodiment) for cooling the cooling liquid that is provided independently of the control unit.

A cooling apparatus 3000 supplies the cooling liquid to the liquid-cooled electronic system 100 such as a computer. In the figure, only one cooling apparatus is shown. Actually, however, a plurality of the electronic systems 100 to be cooled can be connected to the cooling apparatus 3000.

The cooling apparatus 3000 internally has two control units 3100A and 3100B of the same constitution and a distribution header 3200 for distributing the cooling liquid to the plurality of electronic systems 100. Temperature detectors 3300A and 3300B mounted on the distribution header 3200 are used for detecting the temperature of the cooling liquid. Four cooling units 3500A, 3500B, 3500C and 3500D are provided for cooling the cooling liquid. A tank 3400 temporarily stores the cooling liquid returned after being warmed from the plurality of electronic systems 100 and the cooling liquid cooled by the cooling units 3500 A–D. A distribution header 3600 is provided for distributing the cooling liquid to the cooling units 3500 A–D.

The control unit 3100A includes a pump 3110A for supplying the cooling liquid to the liquid-cooled electronic system 100 and a controller 3190A for controlling the operation of the pump 3110A and the cooling units 3500A–D. Also, a valve 3150A, and a check valve 3160A are provided. It should be noted that the pump 3110A and the controller 3190A in the control unit 3100A can be separately detached from the same for replacement.

According to the FIG. 2 embodiment, the control unit 3100B has the same constitution as that of the control unit 3100A and is arranged in parallel to the same. The control unit 3100B is composed of a pump 3110B, a controller 3190B, a valve 3150B, and a check valve 3160B. These components are the same as those used in the control unit 3100A.

Each of the cooling units 3500A, 3500B, 3500C, and 3500D has the same constitution. The cooling unit 3500A is composed of a compressor 3510A, heat exchangers 3520A and 3530A, and a fan 3540A. In a flow path between the heat exchangers 3520A and 3530A, a cooling medium such as Freon is made to flow by the compressor 3510A, constituting a refrigeration cycle. The cooling liquid flows from the distribution header 3600 into the heat exchanger 3520A to be cooled. The warmed cooling medium is cooled in the heat exchanger 3530A by the fan 3540A in accordance with a conventional refrigeration cycle.

The present embodiment further includes a higher order controller 2000 for controlling the controllers 3190A and 3190B.

According to the present embodiment, the two control units 3100A and 3100B do not operate simultaneously. While one is in operation, the other is in a stopped (standby) state. In what follows, it is assumed that the cooling control unit 3100A is in the operating state while the other, control unit 3100B, is in the standby state.

The controller 3190A transmits a drive signal to pump 3110A which then pumps the cooling liquid stored in the tank 3400 through the open valve 3150A via the check valve 3160A to distribution header 3600. The cooling liquid is distributed by the distribution header 3600 to the four cooling units 3500A, 3500B, 3500C and 3500D, and the distribution header 3200. It is assumed that, of the four cooling units, the compressors of the three cooling units, for example 3500A, 3500B, and 3500C, are controlled to operate by a control signal coming from the controller 3190A and therefore these cooling units are providing a cooling capability, while the remaining cooling unit 3500D is in the stopped (standby) state. The cooling efficiency of the operating cooling units can be varied by the control signal coming from the controller 3190A. The cooling liquid cooled by the three cooling units 3500A, 3500B, and 3500C is returned to the tank 3400. The cooling liquid is distributed by the header 3200 in a plurality of flow paths to the liquid-cooled electronic system 100. The cooling liquid warmed by the liquid-cooled electronic system 100 is returned to the tank 3400.

The temperature of the cooling liquid is detected by the temperature detector 3300A mounted on the distribution header 3200. Based on the detected temperature, the controller 3190A controls the rotational speed of the compressor 3510A so that the temperature of the cooling liquid is set to a predetermined value, for example 23° C. If, for example, the temperature of the cooling liquid detected by the temperature detector 3300A is found to be higher than the predetermined level, the controller 3190A increases the rotational speed of the compressor 3510A to lower the temperature of the cooling liquid.

It should be noted that the cooling liquid is prevented by the check valve 3160B from entering the control unit 3100B that is in the stopped state.

Thus constituted, the present embodiment allows the liquid-cooled electronic system to be kept cooled, when upgrading the controller 3190A, by stopping the controller 3190A and operating the controller 3190B, thereby keeping the liquid-cooled electronic system in the operating state.

The higher controller 2000 that controls the controllers 3190A and 3190B monitors the operations of these lower controllers according to a predetermined timing to detect a fault in the controller 3190A. If a fault is detected, control is switched automatically from the failing controller 3190A to the controller 3190B, thereby automatically switching the cooling operation from the cooling control unit 3100A to the cooling control unit 3100B to continue the cooling of the liquid-cooled electronic system. Therefore, while the cooling control unit 3100B is cooling the liquid-cooled electronic system, the failing controller 3190A in the cooling control unit 3100A can be replaced.

If the pump 3110A fails, the controller 3190A cannot control the temperature of the cooling liquid to the predetermined level, so that the controller 3190A detects the abnormal state of the component, stops the pump 3110A, and sends an abnormal signal to the controller 3190B of the control unit 3100B. When the abnormal signal is received, the controller 3190B starts the pump 3110B, which causes an automatic switching from the control unit 3100A to the cooling control unit 3100B whereupon the cooling of the liquid-cooled electronic system is continued. If the compressor 3500A fails, the controller 3190A stops the same and drives the compressor 3500D, which was in the standby state, to continue the cooling of the liquid-cooled electronic system. When, during the cooling operation by the control unit 3100B, the failure is located, the control unit 3100A can be replaced or repaired, or the failing pump 3110A or cooling unit 3500A for example can be replaced. If water extraction is required for the replacing operation, the valve 3150A may be closed, thereby preventing interference with the operation of the cooling apparatus 3000 from occurring.

In the embodiment of FIG. 2, the control unit is composed of the two control units 3100A and 3100B. It will be apparent that, if the load of the liquid-cooled electronic system 100 requires a higher cooling capacity and a larger flow quantity of the cooling liquid, the control unit may be composed of three or more units. Also, according to this embodiment, four cooling units 3500A, 3500B, 3500C, and 3500D are provided. It will be apparent that, if the load of the liquid-cooled electronic system 100 requires a lower cooling capacity, the number of cooling units may be three or even two; and conversely if the load requires a higher cooling capacity, the number may be five or more.

As described and according to the present embodiment, the cooling apparatus need not be stopped for servicing the controller, thereby realizing an around-the-clock operation of the cooling apparatus. Further, the cooling apparatus need not be stopped for servicing the other components, thereby ensuring the around-the-clock availability of the cooling apparatus.

While the preferred embodiments of the present invention have been described using specific terms, such description is for illustrative purposes only, and it is to be understood that changes and variations may be made without departing from the spirit or scope of the appended claims.

What is claimed is:

1. An electronic system cooling apparatus, comprising:
   at least two cooling units connected in parallel for supplying a cooling liquid to a liquid-cooled electronic system;
   each of said cooling units having a supply of cooling liquid and a pump for circulating the cooling liquid through a heat exchanger, a temperature sensor and a controller connected to the temperature sensor and the pump for controlling the pump and the temperature of the cooling liquid in accordance with the sensed temperature;
   wherein each one of said cooling units has a different said controller respectively connected to ones of said temperature sensor and said pump that correspond to said one cooling unit;
   wherein one of said cooling units is in a standby mode and the others of said cooling units are in an operating mode during normal operation; and
   wherein said controllers of each of said cooling units are connected together so that when a fault occurs in said cooling unit in the operation mode, said controller of said cooling unit in a standby mode takes over for said cooling unit in which the fault occurs without interruption of cooling of the electronic cooling system.

2. An electronic system cooling apparatus as claimed in claim 1, wherein said cooling liquid is prevented from flowing between said cooling units in the operating mode and said cooling unit in the standby mode by a check valve disposed between a cooling liquid connection between said cooling units.

3. An electronic system cooling apparatus, comprising:
   a plurality of cooling units connected together in parallel for supplying a cooling liquid to a liquid-cooled electronic system;
   each of said cooling units having a supply of cooling liquid, a pump, a heat exchanger for cooling the cooling liquid, said pump circulating the cooling liquid through the heat exchanger and the electronic system for cooling the electronic system, a temperature sensor, a mixing valve for diverting a part of the flow of the cooling liquid past said heat exchanger to adjust a temperature of the cooling liquid and a controller connected to the temperature sensor and the pump for controlling the pump and the mixing valve flow to control the temperature of the cooling liquid in accordance with the sensed temperature;
   wherein each one of said cooling units has a different said controller respectively connected to ones of said temperature sensor and said pump that correspond to said one cooling unit;
   wherein at least one of said cooling units is in a standby mode and the others of said cooling units are in an operating mode during normal operation; and
   wherein said controllers of each of said cooling units are connected together so that when a fault occurs in one of said cooling units in the operation mode, said controller of said cooling unit in a standby mode takes over for said cooling unit in which the fault occurs without interruption of cooling of the electronic cooling system.

4. An electronic system cooling apparatus as claimed in claim 3, wherein said mixing valve is a three way valve for controlling the flow of the cooling liquid from the pump to the heat exchanger and the flow of cooling liquid from the pump directly to said electronic cooling system for adjusting the temperature of the cooling liquid passing through the electronic system.

5. An electronic system cooling apparatus as claimed in claim 3, further including a distribution header connected between said cooling units and said electronic system wherein said temperature sensor of each of said cooling units senses a temperature of the liquid at the distribution header.

6. An electronic system cooling apparatus as claimed in claim 3, further including an operation monitoring controller connected to each of said controllers for detecting a fault in any of said controllers in said operating mode and for controlling switching of operation from said cooling unit in which a fault in operation is detected to said one cooling unit in the standby mode.

7. An electronic system cooling apparatus as claimed in claim 6, wherein said cooling liquid is prevented from flowing between said one cooling unit that takes over for said cooling unit in which the fault was detected by a valve disposed between each of said cooling units so that loss of cooling liquid in said cooling unit in which a fault is detected does not cause a loss of fluid in said one cooling unit.

8. An electronic system cooling apparatus as claimed in claim 3, including N+1 of said cooling units wherein N of said cooling units are used in the operation mode and a remaining said cooling unit is said one cooling unit in the standby mode.

9. An electronic system cooling apparatus, comprising:
   at least two control units connected in parallel for supplying a cooling liquid to a liquid-cooled electronic system;
   a plurality of heat exchangers,
   each of said control units having a supply of cooling liquid, a pump for circulating the cooling liquid through the heat exchangers, a temperature sensor and a controller connected to the temperature sensor and the pump for controlling the pump and the temperature of the cooling liquid in accordance with the sensed temperature;
   wherein each one of said control units has a different said controller respectively connected to ones of said temperature sensor and said pump that correspond to said one cooling unit;
   wherein one of said control units and one of said heat exchangers is in a standby mode and the others of said control units and said heat exchangers are in an operating mode during normal operation;
   wherein when one of said heat exchangers has a fault in operation, said controller controls said heat exchanger in the standby mode to take over for said heat exchanger in which said fault has occurred; and
   wherein said controllers of each of said control units are connected together so that when a fault occurs in said control unit in the operation mode, said controller of said control unit in a standby mode takes over for said control unit in which the fault occurs without interruption of cooling of the electronic cooling system.

10. An electronic system cooling apparatus as claimed in claim 9, wherein said cooling liquid is prevented from flowing between said control units in the operating mode and said control unit in the standby mode by a check valve disposed between a cooling liquid connection between said control units.

11. An electronic system cooling apparatus, comprising:

a plurality of control units connected together in parallel for supplying a cooling liquid to a liquid-cooled electronic system;

a plurality of heat exchangers for cooling the cooling liquid, each of said control units having a supply of cooling liquid, a pump for circulating the cooling liquid through the heat exchanger and the electronic system for cooling the electronic system, a temperature sensor, a first distribution header for directing the flow of the cooling liquid to the heat exchangers and a controller connected to the temperature sensor and the pump for controlling the pump and the heat exchangers to control the temperature of the cooling liquid in accordance with the sensed temperature;

wherein each one of said control units has a different said controller respectively connected to ones of said temperature sensor and said pump that correspond to said one cooling unit;

wherein at least one of said control units is in a standby mode and the others of said control units are in an operating mode during normal operation;

wherein at least one of said heat exchangers is in a standby mode and the others of said heat exchangers are in an operating mode under control of said controllers of said control units in an operating mode so that when a fault is detected in one of said heat exchangers in the operating mode, said heat exchanger in said standby mode takes over for said heat exchanger in which said fault occurs; and wherein said controllers of each of said control units are connected together so that when a fault occurs in one of said control units in the operation mode, said controller of said control unit in a standby mode takes over for said control unit in which the fault occurs without interruption of cooling of the electronic cooling system.

12. An electronic system cooling apparatus as claimed in claim 11, wherein said controller of each of said control units adjusts the temperature of the cooling liquid passing through the electronic system by controlling the cooling rate of said heat exchangers.

13. An electronic system cooling apparatus as claimed in claim 11, further including a distribution header connected between said control units and said electronic system wherein said temperature sensor of each of said control units senses a temperature of the liquid at the distribution header.

14. An electronic system cooling apparatus as claimed in claim 11, further including an operation monitoring controller connected to each of said controllers of said control units for detecting a fault in any of said controllers in said operating mode and for controlling switching of operation from said control unit in which a fault in operation is detected to said one control unit in the standby mode.

15. An electronic system cooling apparatus as claimed in claim 14, wherein said cooling liquid is prevented from flowing between said one control unit that takes over for said control unit in which the fault was detected by a valve disposed between each of said control units so that loss of cooling liquid in said control unit in which a fault is detected does not cause a loss of fluid in said one control unit.

16. An electronic system cooling apparatus as claimed in claim 11, including N+1 of said control units wherein N of said control units are used in the operation mode and a remaining said control unit is said one control unit in the standby mode.

* * * * *